(12) United States Patent
Hill et al.

(10) Patent No.: US 7,456,097 B1
(45) Date of Patent: Nov. 25, 2008

(54) SYSTEM AND METHOD FOR FACETING VIA TOP CORNERS TO IMPROVE METAL FILL

(75) Inventors: Rodney Hill, Mansfield, TX (US); Victor M. Torres, Irving, TX (US); Richard W. Foote, Jr., Kennedale, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 315 days.

(21) Appl. No.: 10/999,542

(22) Filed: Nov. 30, 2004

(51) Int. Cl.
*H01L 21/4763* (2006.01)

(52) U.S. Cl. .............. 438/637; 438/640; 257/E21.577; 257/E21.578

(58) Field of Classification Search ............ 438/637, 438/640; 257/E21.577, E21.578
See application file for complete search history.

(56) References Cited

U.S. PATENT DOCUMENTS

| | | | | |
|---|---|---|---|---|
| 5,841,196 A * | 11/1998 | Gupta et al. | ................ | 257/774 |
| 5,883,436 A * | 3/1999 | Sadjadi et al. | ............. | 257/760 |
| 5,950,104 A * | 9/1999 | Linliu | ....................... | 438/640 |
| 6,100,577 A * | 8/2000 | Linliu | ....................... | 257/622 |
| 6,133,153 A * | 10/2000 | Marquez et al. | ............. | 438/706 |
| 6,165,864 A * | 12/2000 | Shen et al. | ................. | 438/396 |
| 6,165,910 A * | 12/2000 | Flanner et al. | ............. | 438/743 |
| 6,232,663 B1 * | 5/2001 | Taniguchi et al. | .......... | 257/758 |
| 6,261,947 B1 * | 7/2001 | McTeer | ..................... | 438/637 |
| 6,329,109 B1 * | 12/2001 | Figura et al. | ................ | 430/11 |
| 6,355,557 B2 * | 3/2002 | Stinnett et al. | ............. | 438/640 |
| 6,368,957 B1 * | 4/2002 | Horio | ........................ | 438/634 |
| 6,384,480 B1 * | 5/2002 | McTeer | ..................... | 257/750 |
| 6,437,387 B2 * | 8/2002 | Gutsche | .................... | 257/301 |
| 6,524,875 B2 * | 2/2003 | Figura et al. | ................ | 438/46 |
| 6,794,757 B1 * | 9/2004 | Smith | ........................ | 257/764 |
| 2003/0227092 A1 * | 12/2003 | Liu et al. | .................... | 257/774 |
| 2004/0166668 A1 * | 8/2004 | Ito | ............................. | 438/637 |
| 2005/0059251 A1 * | 3/2005 | Kao et al. | ................... | 438/701 |

* cited by examiner

*Primary Examiner*—Scott B. Geyer
*Assistant Examiner*—Stanetta D Isaac

(57) ABSTRACT

A system and method is disclosed for providing an etch procedure to facet the top corners of a via in a semiconductor device. A vertical anisotropic dry etch process is applied through an aperture in a resist mask to etch through a dielectric layer down to a bottom conductor layer. The resist mask is removed and an etch process is applied to etch away corner portions of the dielectric layer. The etch process forms a flat sidewall surface in the portions of the dielectric layer that form the via. The flat sidewall surface is disposed at an obtuse angle with respect to the top surface of the dielectric layer and at an obtuse angle with respect to a vertical sidewall of the via cavity. The flat sidewall surface and the absence of sharp corners facilitate a subsequent metal fill process.

20 Claims, 5 Drawing Sheets

SYSTEM AND METHOD FOR FACETING VIA TOP CORNERS TO IMPROVE METAL FILL

TECHNICAL FIELD OF THE INVENTION

The present invention is generally directed to the manufacture of semiconductor circuits and, in particular, to a system and method to facet via top corners to improve metal fill in a via in a semiconductor circuit.

BACKGROUND OF THE INVENTION

When a semiconductor circuit is manufactured it is necessary to form a plurality of via cavities between individual layers of the semiconductor circuit in order to provide conduits for electrical communication between metal layers of the semiconductor circuit. In order to facilitate the efficient filling of the via cavities with metal fill material (e.g., aluminum) the sidewalls of the via cavities should have an appropriately shaped profile. That is, the shape of a via cavity should not interfere with a subsequent via fill process.

Prior art methods of forming a via cavity, however, often leave one or more sharp edges in the sidewall profile of the via cavity. Other prior art methods of forming a via cavity create via cavity sidewalls that have a concave profile. The prior art improves the line-of-sight metal deposition into the via holes compared to a completely vertical sidewall produced by anisotropic via etching. However, the demands on metal deposition into submicron geometry via holes in use today require more than just line-of-sight deposition. The aluminum must be deposited at a high temperature to allow the aluminum to flow into the vias and provide low resistance electrical pathways.

The presence of sharp edges or the presence of a concave profile in a via cavity sidewall tends to impede the flow of the fill material and cause the fill process of via cavity to be incomplete. That is, voids in the fill material may be caused by the sharp edges in the sidewalls of the via cavity. Voids in the fill material may also be caused by the presence of a concave profile in the sidewalls of the via cavity.

Therefore, there is a need in the art for a system and method that is capable of providing a via cavity in a semiconductor circuit that has an optimally shaped sidewall profile. There is also a need in the art for a system and method that is capable of providing a via cavity having a sidewall profile that facilitates a subsequent via fill process.

SUMMARY OF THE INVENTION

To address the above-discussed deficiencies of the prior art, it is a primary object of the present invention to provide a system and method for faceting the top corners of a via in a semiconductor circuit to improve the metal fill of the via.

In one advantageous embodiment of the present invention, a semiconductor device is provided that comprises a silicon substrate covered with a first dielectric layer. On top of the first dielectric layer (or embedded in the first dielectric layer) is a patterned conductor layer referred to as the "bottom" conductor layer. The silicon substrate and the first dielectric layer and the bottom conductor layer are covered with a second dielectric layer. The second dielectric layer is covered with a resist mask having portions that form an aperture through the resist mask.

A vertical anisotropic dry etch process is applied through the aperture of the resist mask to etch through the second dielectric layer down to the bottom conductor layer. The resist mask is then removed. An etch process is then applied to etch away corner portions of the second dielectric layer to create a facet. The etch process forms a flat sidewall surface in the portions of the second dielectric layer that form the via.

The flat sidewall surface of the via is disposed at an obtuse angle with respect to the top surface of the second dielectric layer. The flat sidewall surface of the via is also disposed at an obtuse angle with respect to the vertical sidewalls of the via cavity. The profile of the flat sidewall surface of the present invention facilitates a subsequent metal fill process of the via cavity.

It is an object of the present invention to provide a system and method for faceting the top corners of a via in a semiconductor circuit to improve the metal fill of the via.

It is also an object of the present invention to provide a system and method for providing an etch procedure to create a flat sidewall surface of a via cavity that improves the metal fill of the via.

It is yet another object of the present invention to provide a system and method for providing an etch procedure to create a flat sidewall surface of a via cavity that is disposed at an obtuse angle with respect to a top surface of a dielectric layer.

It is another object of the present invention to provide a system and method for providing an etch procedure to create a flat sidewall surface of a via cavity that is disposed at an obtuse angle with respect to a vertical sidewall of the via cavity.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 1 illustrates a cross sectional view of a prior art integrated circuit device showing a second dielectric layer covered with a resist mask having an aperture for etching a via cavity;

FIG. 2 illustrates a cross sectional view of the prior art integrated circuit device shown in FIG. 1 in which a wet etch process has been applied to etch a via cavity through a first portion of the second dielectric layer;

FIG. 3 illustrates a cross sectional view of the prior art integrated circuit device shown in FIG. 2 in which a vertical anisotropic dry etch process has been applied to extend the via cavity down to a bottom conductor layer in a first dielectric layer;

FIG. 4 illustrates a cross sectional view of the prior art integrated circuit device shown in FIG. 3 in which the resist mask has been removed;

FIG. 5 illustrates a cross sectional view of the prior art integrated circuit device shown in FIG. 4 on which a layer of metal has been deposited to partially fill the via cavity;

FIG. 6 illustrates a cross sectional view of the prior art integrated circuit device shown in FIG. 4 to which an etch process has been applied to round off the sharp edges of the via cavity;

FIG. 7 illustrates a cross sectional view of an integrated circuit device of the present invention showing a second dielectric layer covered with a resist mask having an aperture for etching a via cavity;

FIG. 8 illustrates a cross sectional view of the integrated circuit device shown in FIG. 7 in which a vertical anisotropic dry etch process has been applied to etch a via cavity through the second dielectric layer down to a bottom conductor layer in a first dielectric layer;

FIG. 9 illustrates a cross sectional view of the integrated circuit device shown in FIG. 8 in which the resist mask has been removed;

FIG. 10 illustrates a cross sectional view of the integrated circuit device shown in FIG. 9 in which an etch process has been applied to remove corner portions of the second dielectric layer from the top edge of the via cavity;

FIG. 11 illustrates a cross sectional view of the integrated circuit device shown in FIG. 10 in which a metal fill process has been applied to fill the via cavity with metal.

DETAILED DESCRIPTION OF THE INVENTION

Figure 1:
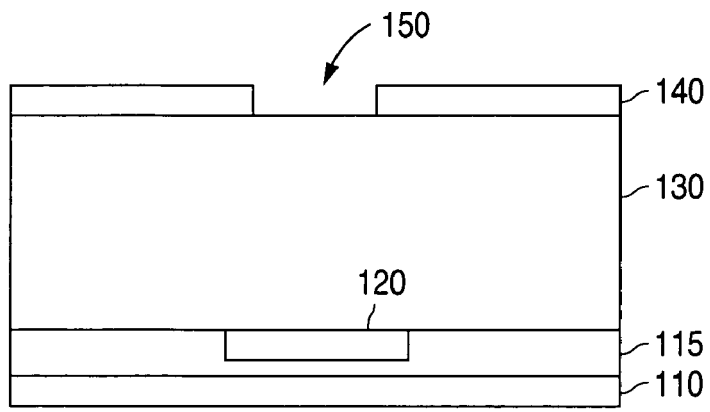
FIGS. 1 through 6 illustrate successive stages in the construction of a via in a prior art integrated circuit device.

FIGS. 1 through 12 and the various embodiments used to describe the principles of the present invention in this patent document are by way of illustration only and should not be construed in any way to limit the scope of the invention. Those skilled in the art will understand that the principles of the present invention may be implemented in any type of suitably arranged integrated circuit device.

To simplify the drawings the reference numerals from previous drawings will sometimes not be repeated for structures that have already been identified.

In order to better understand the principles of the present invention a description of the construction of an exemplary prior art via in an integrated circuit device will first be given. FIGS. 1 through 6 illustrate successive stages in the construction of a via in the exemplary prior art integrated circuit device.

The exemplary prior art integrated circuit device shown in FIG. 1 comprises a silicon substrate 110. A first dielectric layer 115 is placed over silicon substrate 110. An exemplary bottom conductor layer 120 is embedded within first dielectric layer 115. First dielectric layer 115 and bottom conductor layer 120 are covered with a second dielectric layer 130. Second dielectric layer 130 is covered with resist mask 140. As shown in FIG. 1, resist mask 140 has an aperture 150 located with resist mask 140 for etching a via cavity down through the second dielectric layer 130.

Figure 2:
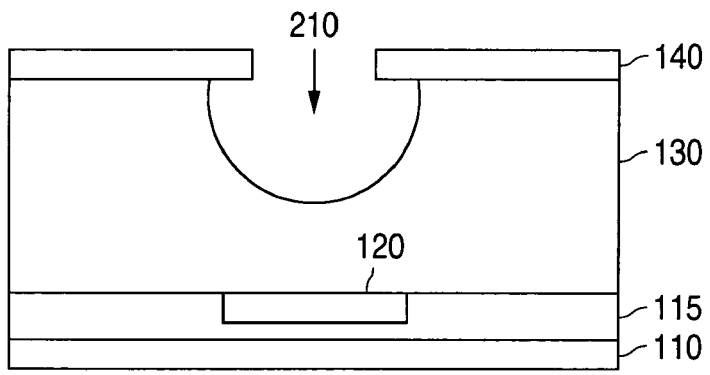

In the next step of the exemplary prior art method an isotropic wet etch process is applied to partially etch a via cavity within the second dielectric layer 130. The result of applying the isotropic wet etch process is shown in FIG. 2. The isotropically etched via cavity is designated with reference numeral 210 in FIG. 2.

Figure 3:
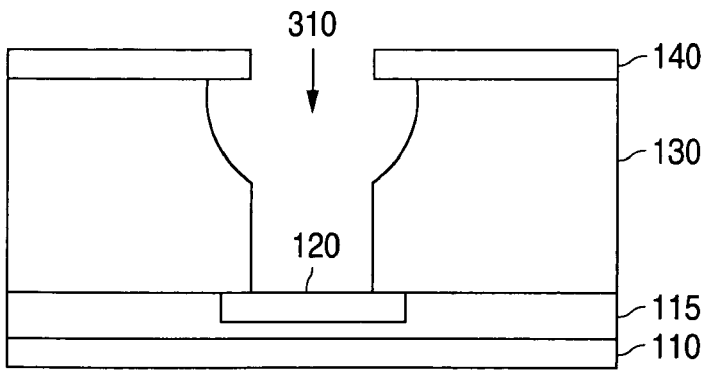

In the next step of the exemplary prior art method a vertical anisotropic dry etch process is then applied to extend the via cavity 210 down to bottom conductor layer 120 in first dielectric layer 115 on silicon substrate 110. The result of applying the vertical anisotropic dry etch process is shown in FIG. 3. The extended via cavity is designated with reference numeral 310 in FIG. 3.

Figure 4:
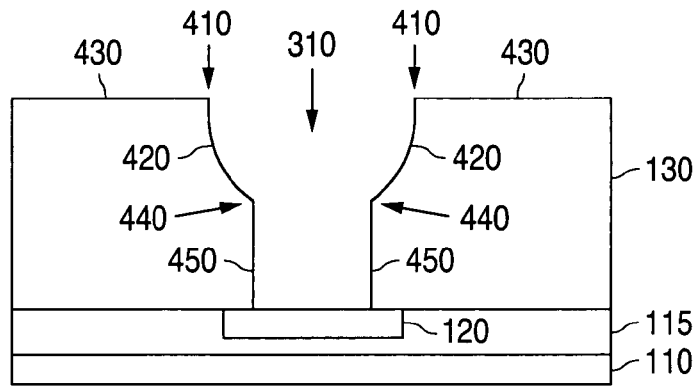

In the next step of the exemplary prior art method the resist mask 140 is then removed. FIG. 4 illustrates a cross sectional view of the prior art integrated circuit device shown in FIG. 3 in which the resist mask 140 has been removed. The etched portions of the second dielectric layer 130 shown in FIG. 4 have sharp corners. In particular, there is a first sharp corner 410 located at the juncture where the curved surface 420 of the second dielectric layer 130 meets the top layer 430 of second dielectric layer 130. Because the via cavity 310 has cylindrical symmetry (and because FIG. 4 is a cross sectional view) the sharp corner 410 is shown in two locations in FIG. 4.

Similarly, there is a second sharp corner 440 located at the juncture where the curved surface 420 of the second dielectric layer 130 meets the vertical walls 450 of via cavity 310. Because the via cavity 310 has cylindrical symmetry (and because FIG. 4 is a cross sectional view) the sharp corner 440 is shown in two locations in FIG. 4. The presence of the curved surface 420 in the second dielectric layer 130 between the two sharp corners 410 and 440 gives the top portion of via cavity 310 a "wine glass" shape.

Figure 5:
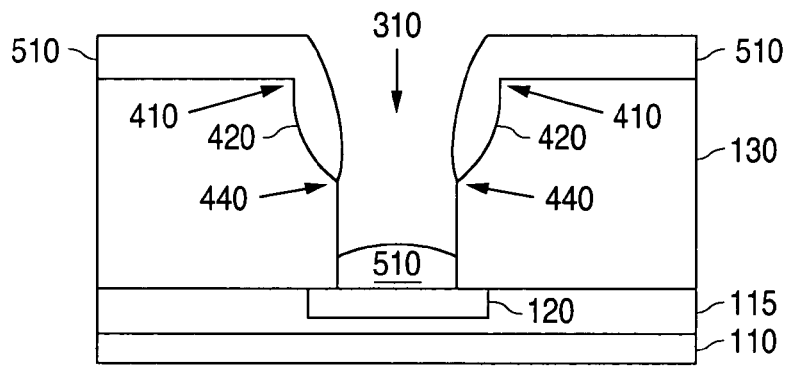

When the via cavity 310 is subsequently filled with aluminum the presence of the sharp corners 410 and 440 may interfere with the diffusion of aluminum into the via cavity 310. This may result in an incomplete fill of the via cavity 310. FIG. 5 illustrates a cross sectional view of the prior art integrated circuit device shown in FIG. 4 on which a metal 510 has been deposited (e.g., diffused aluminum). As shown in FIG. 5, the metal 510 covers the top portions 430 of the second dielectric layer 130 and partially fills the via cavity 310. The curved surface 420 between sharp corner 410 and sharp corner 440 forms a concave profile at the top of the via cavity 310.

This concave profile tends to retain portions of the aluminum fill material and cause the aluminum fill process of via cavity 310 to be incomplete. That is, voids may be created in the metal layer 510. In the example shown in FIG. 5, the portions of the metal layer 510 that have been deposited on the bottom conductor layer 120 are not electrically connected to the other portions of the metal layer 510.

Figure 6:
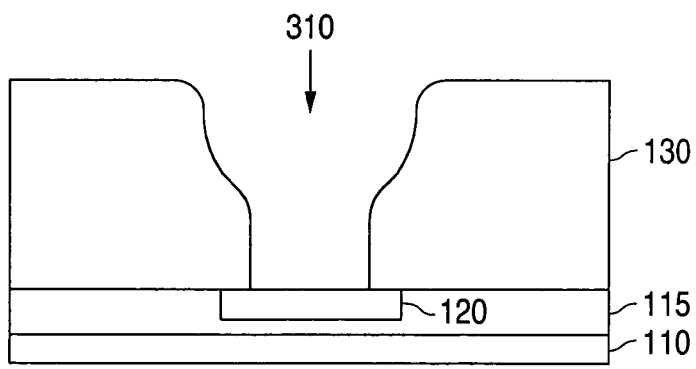

There have been some prior art attempts to remove the sharp corners 410 and 440. For example, in U.S. Pat. No. 5,453,403 issued to Meng et al. on Sep. 26, 1995, an Argon sputter etch process is applied to the dielectric layer in order to "smooth the sharp edges." The result of applying such a process to the device shown in FIG. 4 is shown in FIG. 6. The sharp edges 410 and 440 have been removed from the via cavity 310 by rounding off the edges.

The Meng et al. process provides some improvement. Although it smoothes the sharp edges considerably, the process does not completely remove the concave profile that is created by the dry-wet-dry etch process. That is, a concave surface still remains within the sidewall of the via cavity 310. The concave surface present in a sidewall of a prior art via is capable of interfering with the application of a subsequent metal fill process.

The system and method of the present invention provides a via cavity that has a flat sidewall surface that is formed at an angle with respect to the top edge of the via cavity. A description of the construction of an exemplary via in an integrated circuit device in accordance with the principles of the present invention will now be given. FIGS. 7 through 11 illustrate successive stages in the construction of a via in an integrated circuit device in accordance with the principles of the present invention.

The term "via" is used generically to refer to an opening or aperture in a dielectric between two sequential conductive layers. For example, the opening could be between a first metal layer and a second metal layer or between a second metal layer and a third metal layer. The opening could also be between a semiconductor substrate (or polysilicon layer) and a first metal layer. Sometimes the opening in a dielectric between sequential conductive layers is referred to as a "contact" or "buried contact." As used in this patent document the term "via" shall be used generically to refer to any opening or aperture in a dielectric between two sequential conductive layers.

Figure 7:
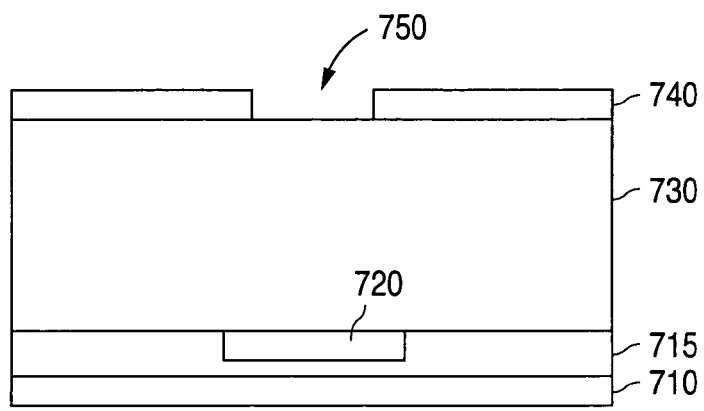
FIGS. 7 through 11 illustrate successive stages in the construction of a via in an integrated circuit device in accordance with the principles of the present invention.

An exemplary embodiment of an integrated circuit device of the present invention shown in FIG. 7 comprises a silicon substrate 710. A first dielectric layer 715 is placed over silicon substrate 710. An exemplary bottom conductor layer 720 is embedded within first dielectric layer 715. Bottom conductor layer 720 may comprise any electrically conductive material (e.g., metal). First dielectric layer 715 and bottom conductor layer 720 are covered with a second dielectric layer 730. Second dielectric layer 730 may comprise silicon dioxide material. Second dielectric layer 730 is covered with resist mask 740. As shown in FIG. 7, an aperture 750 is formed within resist mask 740 for etching a via cavity down through the second dielectric layer 730.

Figure 8:
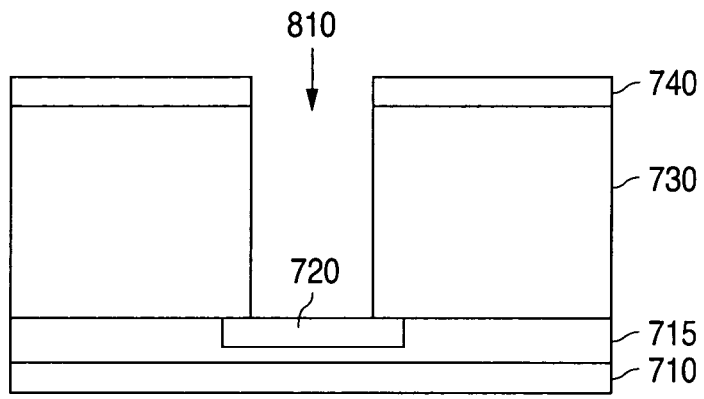

In the next step of the exemplary method of the present invention a vertical anisotropic dry etch process is applied to etch a via cavity 810 through the second dielectric layer 730 down to the bottom conductor layer 720 in the first dielectric layer 715 on silicon substrate 710. The result of applying the vertical anisotropic dry etch process is shown in FIG. 8.

Figure 9:
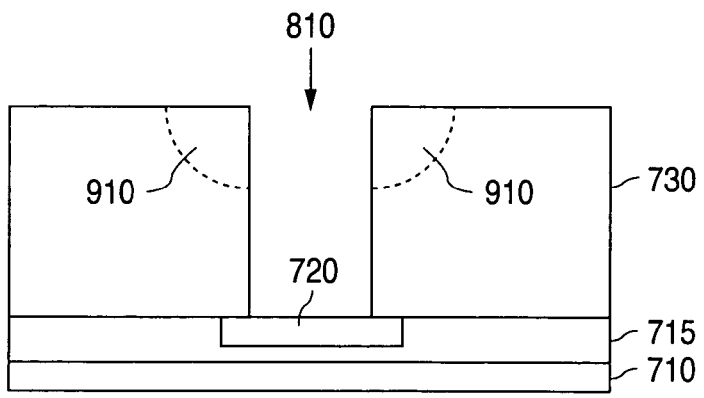

In the next step of the exemplary method of the present invention the resist mask 740 is removed from the second dielectric layer 730. The result of removing the resist mask 740 is shown in FIG. 9. The removal of resist mask 740 exposes the tops of the corner portions 910 of second dielectric layer 730 (shown in dotted outline) that are located at the top edge of via cavity 810.

In the next step of the exemplary method of the present invention an etch process is applied to remove the corner portions 910 of the second dielectric layer 730 from the top edge of via cavity 810. In one advantageous embodiment of the invention the etch process is a sputter etch process. Those skilled in the art understand that other types of etch process may be used including, but not limited to, ion beam milling, reactive ion etching, and high density plasma etching. The etch process etches away the corner portions 910 to form a flat sidewall surface 1020 in the walls of the via cavity.

Figure 10:
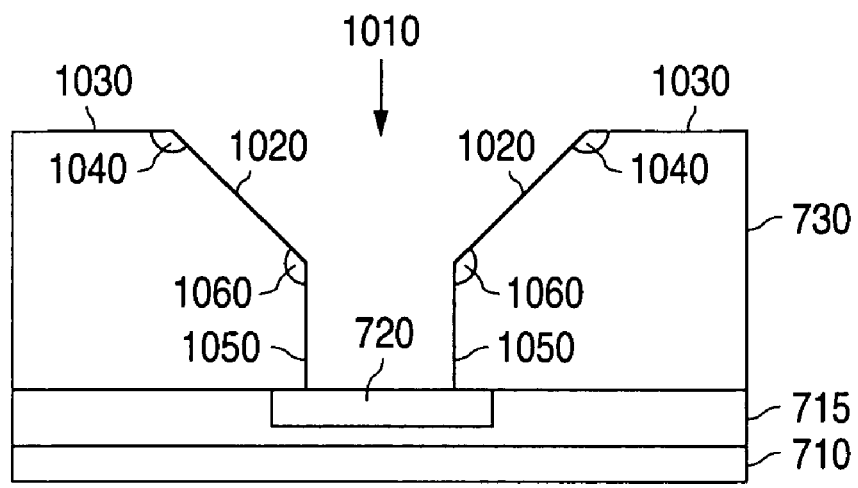

The result of applying the etch process is shown in FIG. 10. The via cavity of the present invention is designated with reference numeral 1010 in FIG. 10. Because the via cavity 1010 has cylindrical symmetry (and because FIG. 10 is a cross sectional view) the flat sidewall surface 1020 is shown in two locations in FIG. 10.

As also shown in FIG. 10, the flat sidewall surface 1020 is formed at an angle with respect to the top surface 1030 of the second dielectric layer 730. The angle 1040 between the flat sidewall surface 1020 and the top surface 1030 of the second dielectric layer 730 is an obtuse angle that is greater than ninety degrees (90°).

The flat sidewall surface 1020 is also formed at an angle with respect to the vertical sidewalls 1050 of via cavity 1010. The angle 1060 between the flat sidewall surface 1020 and the vertical sidewalls 1050 of the via cavity 1010 is also an obtuse angle that is greater than ninety degrees (90°).

Because the flat sidewall surface 1020 of via cavity 1010 is disposed at an obtuse angle with respect to the top surface 1030 and is also disposed at an obtuse angle with respect to the vertical sidewalls 1050, the flat sidewall surface 1020 may also referred to as a flat facet surface 1020.

The flatness of the flat facet surface 1020 is conducive to line-of-sight metal deposition into the bottom of the via cavity 1010. More importantly, the metal that is deposited at high wafer temperatures can thermally diffuse more efficiently into the bottom portion of the via than is possible with the prior art. That is, the shape of via cavity 1010 of the present invention makes the metal fill process easier to perform and more efficient than conventional prior art metal fill processes. The metal material that is used to fill via cavity 1010 more completely fills the bottom of the via cavity 1010. This reduces the occurrence of voids within the metal fill material during a metal fill process.

Figure 11:
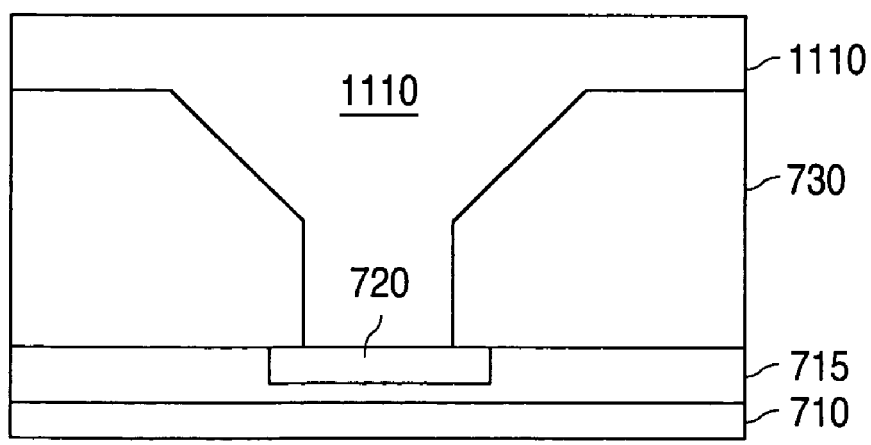

In the next step of the exemplary method of the present invention a conventional metal fill process is employed to fill via cavity 1010 with metal 1110. The result of applying the aluminum fill process is shown in FIG. 11.

Figure 12:
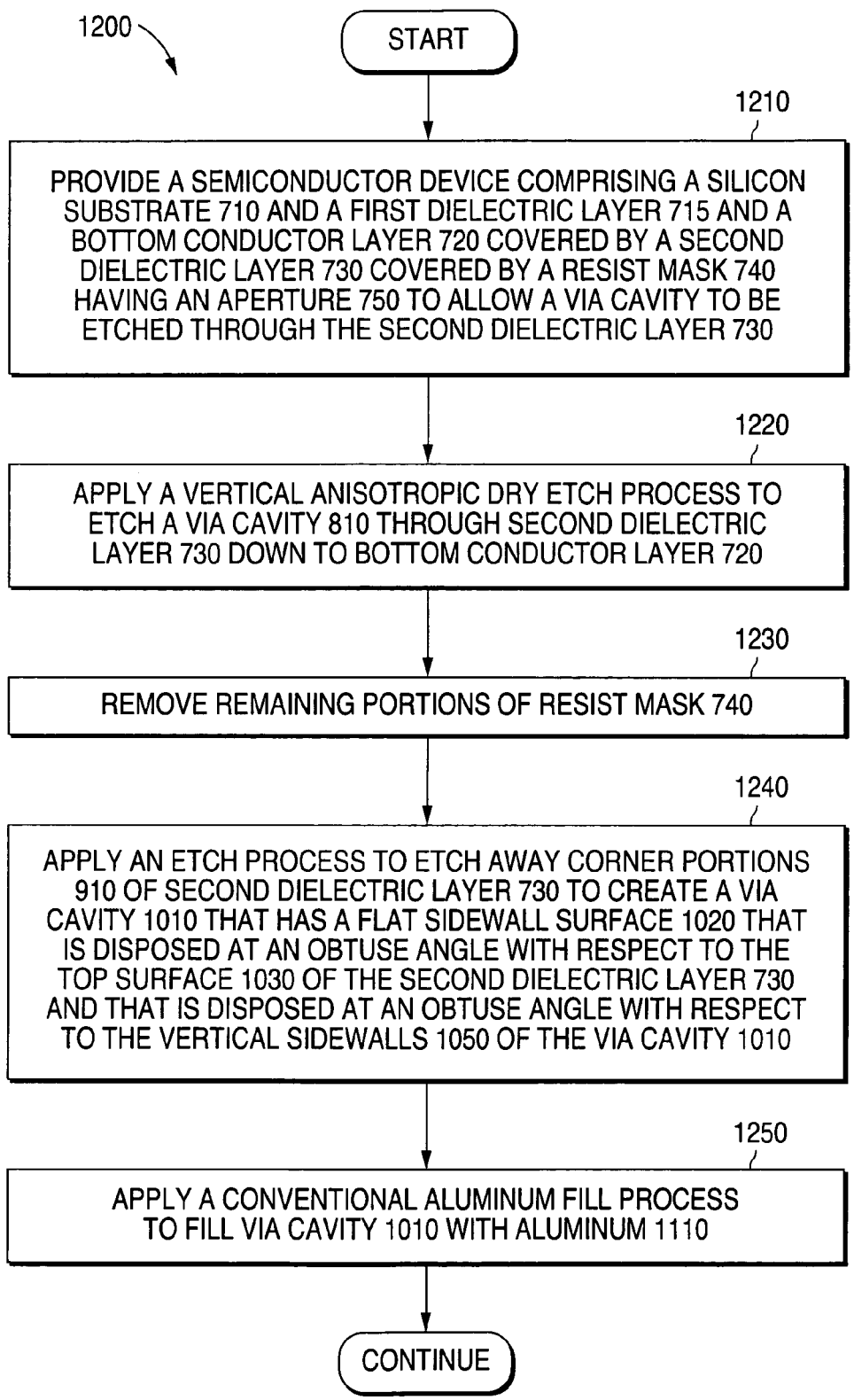
FIG. 12 illustrates a flow chart showing the steps of an advantageous embodiment of the method of the present invention.

FIG. 12 illustrates a flow chart 1200 showing the steps of an advantageous embodiment of the method of the present invention. First a semiconductor device is provided of the type that comprises a silicon substrate 710 covered with a first dielectric layer 715 and a bottom conductor layer 720 located on or embedded within the first dielectric layer 715. The first dielectric layer 715 and the bottom conductor layer 720 are covered by a second dielectric layer 730. The second dielectric layer 730 is covered by a resist mask 740 that is formed with an aperture 750 to allow a via cavity to be etched through the second dielectric layer 730 (step 1210). Then a vertical anisotropic dry etch process is applied to etch a via cavity 810 through the second dielectric layer 730 down to the bottom conductor layer 720 (step 1220).

Then the remaining portions of the resist mask 740 are removed (step 1230). Then an etch process is applied to etch away the corner portions 910 of second dielectric layer 730 to create a via cavity 1010 that has a flat sidewall surface 1020 disposed at an obtuse angle with respect to the top surface 1030 of the second dielectric layer 730 and at an obtuse angle with respect to the vertical sidewalls 1050 of the via cavity 1010 (step 1240). Then a conventional aluminum fill process is applied to fill via cavity 1010 with aluminum 1110 (step 1250).

Although the present invention has been described with an exemplary embodiment, various changes and modifications may be suggested to one skilled in the art. It is intended that the present invention encompass such changes and modifications as fall within the scope of the appended claims.

What is claimed is:

1. A method for forming a via in a semiconductor device of a type that comprises a silicon substrate and a first dielectric layer on which a bottom conductor layer is located, said first dielectric layer and said bottom conductor layer covered with a second dielectric layer, and said second dielectric layer covered with a resist mask having portions that form an aperture through said resist mask, said method comprising the steps of:

applying a first vertical anisotropic dry etch process through said aperture in said resist mask to said second dielectric layer;

etching a via cavity though said second dielectric layer down to said bottom conductor layer with said vertical anisotropic dry etch process;

removing said resist mask from said second dielectric layer; and applying a second etch process to said second dielectric layer to etch away corner portions of said second dielectric layer.

2. The method as set forth in claim 1, further comprising the step of:

etching away said corner portions of said second dielectric layer to form a flat sidewall surface of said via cavity wherein said flat sidewall surface is disposed at a first angle with respect to a top surface of said second dielectric layer.

3. The method as set forth in claim 2, wherein said first angle of said flat sidewall surface with respect to said top surface of said second dielectric layer is an obtuse angle.

4. The method as set forth in claim 2, further comprising the step of applying a metal fill process to fill said via cavity.

5. The method as set forth in claim 2, wherein said step of etching away said corner portions of said second dielectric layer to form a flat sidewall surface of said via cavity causes said flat sidewall surface to be disposed at a second angle with respect to a vertical sidewall of said via cavity.

6. The method as set forth in claim 5, wherein said second angle of said flat sidewall surface with respect to said vertical sidewall of said via cavity is an obtuse angle.

7. The method as set forth in claim 5, further comprising the step of applying a metal fill process to fill said via cavity.

8. The method as set forth in claim 1, wherein the bottom conductive layer comprises metal.

9. The method as set forth in claim 1, wherein the second dielectric layer comprises silicon dioxide.

10. The method as set forth in claim 1, wherein the second etch process is one of a sputter etch process, ion beam milling, reactive ion etching, and high density plasma etching.

11. A method for forming a via in a semiconductor device of a type that comprises a silicon substrate and a first dielectric layer on which a bottom conductor layer is located, said first dielectric layer and said bottom conductor layer covered with a second dielectric layer, and said second dielectric layer covered with a resist mask having portions that form an aperture through said resist mask, said method comprising the steps of:

applying a first vertical anisotropic dry etch process through said aperture in said resist mask to said second dielectric layer;

etching a via cavity though said second dielectric layer down to said bottom conductor layer with said vertical anisotropic dry etch process;

removing said resist mask from said second dielectric layer; and applying a second etch process to said second dielectric layer to etch away corner portions of said second dielectric layer to form a flat sidewall surface of said via cavity in said second dielectric layer.

12. The method as set forth in claim 11, wherein said flat sidewall surface is disposed at a first angle with respect to a top surface of said second dielectric layer.

13. The method as set forth in claim 12, wherein said first angle of said flat sidewall surface with respect to said top surface of said second dielectric layer is an obtuse angle.

14. The method as set forth in claim 12, further comprising the step of applying a metal fill process to fill said via cavity.

15. The method as set forth in claim 12, wherein said flat sidewall surface is disposed at a second angle with respect to a vertical sidewall of said via cavity.

16. The method as set forth in claim 15, wherein said second angle of said flat sidewall surface with respect to said vertical sidewall of said via cavity is an obtuse angle.

17. The method as set forth in claim 16, further comprising the step of applying a metal fill process to fill said via cavity.

18. The method as set forth in claim 11, wherein the bottom conductive layer comprises metal.

19. The method as set forth in claim 11, wherein the second dielectric layer comprises silicon dioxide.

20. The method as set forth in claim 11, wherein the second etch process is one of a sputter etch process, ion beam milling, reactive ion etching, and high density plasma etching.

* * * * *